US012585851B2

(12) United States Patent
Van Antwerpen et al.

(10) Patent No.: US 12,585,851 B2
(45) Date of Patent: Mar. 24, 2026

(54) SYSTEMS AND METHODS FOR TRACKING SYNTHESIS OPTIMIZATIONS FOR CIRCUIT DESIGNS

(71) Applicant: Intel Corporation, Santa Clara, CA (US)

(72) Inventors: Babette Van Antwerpen, Mountain View, CA (US); Mindy Lam, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 800 days.

(21) Appl. No.: 17/746,924

(22) Filed: May 17, 2022

(65) Prior Publication Data

US 2022/0277123 A1     Sep. 1, 2022

(51) Int. Cl.
*G06F 30/30*          (2020.01)
*G06F 30/31*          (2020.01)
*G06F 30/327*         (2020.01)
*G06F 30/337*         (2020.01)
G06F 30/34           (2020.01)

(52) U.S. Cl.
CPC ............ *G06F 30/337* (2020.01); *G06F 30/31* (2020.01); *G06F 30/327* (2020.01); *G06F 30/34* (2020.01)

(58) Field of Classification Search
None
See application file for complete search history.

(56) References Cited

U.S. PATENT DOCUMENTS

| | | | |
|---|---|---|---|
| 6,237,132 B1 * | 5/2001 | Dean ...................... | G06F 30/33 |
| | | | 716/132 |
| 7,315,990 B2 * | 1/2008 | Archambeault ...... | G06F 30/398 |
| | | | 716/112 |
| 8,166,427 B1 | 4/2012 | Pathak et al. | |
| 9,378,000 B1 * | 6/2016 | Lee ........................... | G06F 8/75 |

* cited by examiner

*Primary Examiner* — Leigh M Garbowski
(74) *Attorney, Agent, or Firm* — InventIQ Legal LLP; Steven J. Cahill

(57)          ABSTRACT

A method is provided for using an integrated circuit design tool to optimize a circuit design for an integrated circuit. Optimizations that affect first circuits in the circuit design and that are performed during synthesis of the circuit design for the integrated circuit are recorded in first records in a database. Second records are recorded in the database that indicate second circuits in the circuit design that fanin to or fanout from the first circuits and that are affected by the optimizations. A root cause of at least one of the optimizations is determined using the first and the second records in the database. A sequence of the optimizations affecting the first and the second circuits is determined using the first and the second records in the database.

20 Claims, 9 Drawing Sheets

Related Hints:

| ID | Object Type | Hpath | Object Name | Sweep Type | Sweep Reason | Instance Type |
|---|---|---|---|---|---|---|
| 29 | port | top-level | out[3] | stuck_at_constant | stuck at 0 | output port |
| 28 | instance | top-level | s[3] | stuck_at_constant | stuck at 0 due to stuck port d | DFFE |
| 27 | inst_port | GEN118 | out | stuck_at_constant | stuck at 0 due to master output port being stuck | Component |
| 25 | inst_port | GEN118\S4 | out | stuck_at_constant | stuck at 0 due to master output port being stuck | Component |
| 23 | inst_port | GEN118\S4\S5 | out | stuck_at_constant | stuck at 0 due to master output port being stuck | Component |
| 21 | inst_port | GEN118\S4\S5\S6 | out | stuck_at_constant | stuck at 0 due to master output port being stuck | Component |
| 19 | instance | GEN118\S4\S5\S6 | sr | stuck_at_constant | stuck at 0 due to stuck port d | DFFE |
| 18 | port | GEN118\S4\S5\S6 | in | stuck_at_constant | stuck at 0 in instance of module | input port |
| 17 | port | GEN118\S4\S5 | in | stuck_at_constant | stuck at 0 in instance of module | input port |
| 16 | port | GEN118\S4 | in | stuck_at_constant | stuck at 0 in instance of module | input port |
| 15 | port | GEN118 | in | stuck_at_constant | stuck at 0 in instance of module | input port |
| 14 | inst_port | GEN114 | out | stuck_at_constant | stuck at 0 due to master output port being stuck | Component |
| 12 | inst_port | GEN114\S1 | out | stuck_at_constant | stuck at 0 due to master output port being stuck | Component |
| 10 | inst_port | GEN114\S1\S2 | out | stuck_at_constant | stuck at 0 due to master output port being stuck | Component |
| 8 | inst_port | GEN114\S1\S2\S3 | out | stuck_at_constant | stuck at 0 due to master output port being stuck | Component |
| 6 | instance | GEN114\S1\S2\S3 | sr | stuck_at_constant | stuck at 0 due to stuck port d | DFFE |
| 5 | port | GEN114\S1\S2\S3 | in | stuck_at_constant | stuck at 0 in instance of module | input port |
| 4 | port | GEN114\S1\S2 | in | stuck_at_constant | stuck at 0 in instance of module | input port |
| 3 | port | GEN114\S1 | in | stuck_at_constant | stuck at 0 in instance of module | input port |
| 2 | port | GEN114 | in | stuck_at_constant | stuck at 0 in instance of module | input port |
| 1 | instance | top-level | r[3] | stuck_at_constant | stuck at 0 due to stuck port d | DFFE |

FIG. 4

SYSTEMS AND METHODS FOR TRACKING SYNTHESIS OPTIMIZATIONS FOR CIRCUIT DESIGNS

FIELD OF THE DISCLOSURE

The present disclosure relates to the design of electronic integrated circuits, and more particularly, to systems and method for tracking synthesis optimizations for circuit designs for integrated circuits.

BACKGROUND

Integrated circuits are often designed intending to be implemented in a programmable logic integrated circuit (IC), such as a field programmable gate array (FPGA). During design of the IC, a circuit schematic and corresponding netlist are generated by a circuit designer, who may also be referred to as a user. The netlist is then fitted to an FPGA, such that the FPGA implements the user-designed circuitry. This fitting process is referred to as synthesis.

BRIEF DESCRIPTION OF THE DRAWINGS

FIG. 4 illustrates an example of a user interface that may be displayed in response to a user selecting an option in the user interface of FIG. 3.

DETAILED DESCRIPTION

Figure 1:
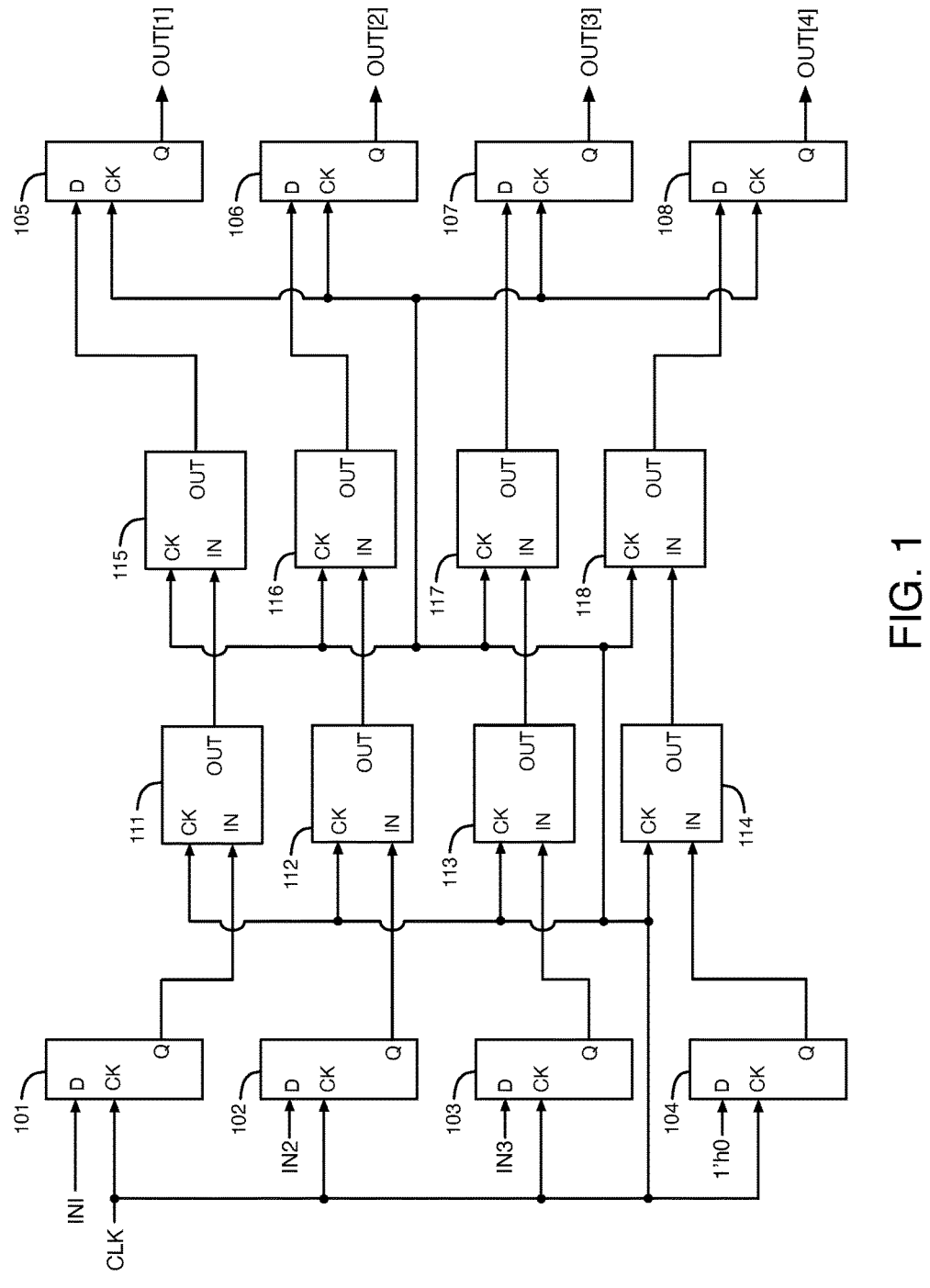
FIG. 1 is a diagram of a portion of a user design for a programmable integrated circuit (IC) that includes logic circuits that were optimized away during synthesis of a netlist for the user design.

As a part of synthesizing a user design for a programmable logic IC, some of the logic circuits in the user design may be duplicated (split) and/or optimized away (i.e., removed) from the netlist. Typically logic circuits are removed for one of three reasons. First, logic circuits may be removed during synthesis because the logic circuits are stuck, that is, the outputs of the logic circuits cannot change. For example, a clock input may be disconnected or tied to a signal source that does not switch, such as a supply voltage. Also, a logic circuit may be stuck because its data input cannot change. For example, the data input may be disconnected or tied to a signal source that does not switch, such as a supply voltage. If a data input of a logic circuit is driven by a second logic circuit that is removed during synthesis, that logic circuit will become stuck. A logic circuit whose output is stuck is not needed in a user design, because the logic circuit can be replaced with a supply voltage or other logic signal.

Second, a logic circuit may be removed during synthesis if the logic circuit does not drive a node. Such a logic circuit is not needed in the user design. For example, the logic circuit output may be disconnected. Also, when a logic circuit drives another logic circuit that is removed, the driving logic circuit is no longer driving a node, that is, the logic circuit does not have a fanout.

Third, a logic circuit may be removed during synthesis if the synthesizer merges the logic circuit with another logic circuit in the circuit. For example, the synthesizer may transfer the fanouts of a first logic circuit to a second logic circuit and remove the first logic circuit. This transfer may occur when two logic circuits are identical in functionality, meaning they are duplicate logic circuits. In this case, it is not necessary to preserve both logic circuits in the circuit. Accordingly, the synthesizer removes one of the duplicate logic circuits and transfers the fanouts of the removed logic circuit to the other logic circuit.

Logic circuits in a user design may also be split. For example, a logic circuit may have too many fanouts for proper operation. Also, a circuit may be easier to route if a logic circuit function is duplicated. Such logic circuits may be split into multiple logic circuits, each driving a smaller load.

A user may cause one or more logic circuits in a user design to become stuck or without a fanout on purpose. However, a logic circuit in a user design can become stuck or without a fanout due to a connection error made by the user. As one example, if a data or clock input is unintentionally left unconnected, the logic circuit becomes stuck and may be removed during synthesis.

Often, one error, such as a clock input left floating, may have dramatic ramifications in the synthesis removal procedure. For example, hundreds or thousands of logic circuits may be removed because of one mistaken connection. As the iterative aspect of synthesis progresses, the removal of this logic circuit may result in further logic circuits being removed from the user design. When a logic circuit is removed, particularly when it is due to an unintended design error, it would be desirable if the user would be informed that the logic circuit was removed, as well as the reason why the logic circuit was removed and further consequences of the logic circuit removal. Conventionally, a list of these removed logic circuits is provided to the user. However, it can be extremely difficult for a user to determine the cause of removal of a large number of logic circuits.

According to some examples disclosed herein, the removal of logic circuits are tracked and reasons for removal are reported to the user. When a logic circuit is removed, various attributes relating to its inputs and associated circuitry, such as its fanins and fanouts, may be determined. These attributes can be processed to generate reasons for removal. This data can be used to create a report that directs a user's attention to the logic circuit or logic circuits of interest.

According to some examples disclosed herein, circuits, methods, software, and apparatuses are provided that track the removal of circuits (such as registers), reasons for the removal of circuits, and further consequences of the removal of circuits during the synthesis of integrated circuits. Further information, such as what other circuits were removed as a consequence of earlier removal, may also be tracked. This information is then provided in an efficient manner to the user for design debugging and verification purposes.

According to a specific example, the reason for a logic circuit removal during the synthesis process may be determined. A logic circuit may be a root cause in that the logic circuit may have no other logic circuits that caused its removal. That is, the conditions for removal of a logic circuit may exist before synthesis begins. For example, a logic circuit input may be stuck at a constant value, because the logic circuit has no data or clock input. Also, a logic circuit may not drive a circuit or device output terminal. Such a logic circuit is the root cause of its removal.

Other logic circuits may have the conditions for their removal arise during the synthesis process. For example, a root-cause logic circuit that provides a data or clock signal to the input of a second logic circuit may be removed, thus causing the removal of the second logic circuit during synthesis. Also, a root-cause logic circuit that is a load for a third logic circuit may be removed, thus causing the removal of the third logic circuit. The root-cause logic circuit is the reason for the removal of the second and third logic circuits. The identity of the root-cause logic circuit and the identity of the logic circuits that are removed as a result of the removal of the root-cause logic circuit are useful information in design debugging.

The reasons for logic circuit removal may be tracked in several ways. As an example, logic circuits may be tracked as the logic circuits are removed. After a first logic circuit or root-cause logic circuit is removed, forward and backward paths are traversed from the removed root-cause logic circuit until other logic circuits or device pins are reached, and these other logic circuits (and possibly other circuits such as intervening logic) are possibly removed and reasons for removal determined. Also, logic circuits found in the forward path from a root-cause logic circuit are identified. Paths from the inputs of these found logic circuits are traced back to source logic circuits or device inputs/outputs, thus possibly leading to other logic circuit removal.

A table may be built at the beginning of synthesis, where logic circuit-to-logic circuit connections are stored. Later, as logic circuits are removed, the table is modified to enter reasons for logic circuit removal. The table may be a unidirectional tree structure where each node points its reasons for removal at another node. In other examples, other data structures can be used. The information in the table may be processed before being provided to the user. As an example, data regarding root-cause logic circuits, reasons for removal, and victims of the removal can be generated and provided to a user. Various steps to an algorithm may be completed in generating this information. The table may be stored in a database.

The processed information may be displayed in various ways. For example, a user interface may list the identity of a number of removed logic circuits and the reasons for their removal. The user interface may also identify a number of root-cause logic circuits and the logic circuits removed as a result. The information may be displayed by a graphical user interface on a monitor or display. Also, the information may be printed or provided in other ways to a user, electronic system, computer, or other device.

These lists may be linked to databases such as schematics and layouts. For example, by passing a cursor over an item in a list, or right-clicking or otherwise identifying the item, information about the item may be found. For example, the item, such as a removed logic circuit, may be highlighted in a schematic or layout. Also, these schematics and layouts may be linked back to the processed information. For example, a removed path may be highlighted in a schematic. In various modes, when the cursor is over a removed logic circuit, or the logic circuit is right-clicked or otherwise identified, a floating box may appear indicating the reasons for removal. Other graphical aids may be incorporated according to various examples.

However, the tables and lists discussed above may become large and hard to navigate. The tables and lists may not provide filtering and may have a limited number of circuits that can be changed during synthesis. The tables and lists may only report some logic circuits optimized during synthesis. These limitations cause at least two disadvantages. First, the actual cause of a logic circuit optimization is often not visible from the table, because the cause is not another logic circuit being optimized away. One common reason that a logic circuit is removed is that a hierarchy instance port is not connected properly, which may not be visible in a report to the user. A first logic circuit may be optimized away because of a second logic circuit in a different hierarchy instance than the first logic circuit. The path between these two logic circuits may not be found from the report, because the logic circuits can go through many hierarchy instances, which makes it hard to pinpoint the cause for the logic circuit removal. The recording of related optimizations may not be fully integrated in the optimizations, which causes relations between optimizations to be missed. The table with logic circuits removed may only show one level of the cause of removal, and the table cannot be used to easily trace back to the root cause of the removal.

According to some examples disclosed herein, systems and methods are provided that assist circuit designers of ICs with debug connectivity issues in their circuit designs, by tracking all logic optimizations that are performed during synthesis. Circuit designs for ICs are also referred to herein as user designs. The systems and methods may create a database having all the optimizations made in a user design during synthesis, including the sequence of optimizations that leads to a specific optimization. The sequence of optimizations can be viewed in a schematic viewer of the original user design. A table may also be presented to a user that has hierarchy instances indicating how many of the logic circuits in each instance was optimized away during synthesis. Filtering and cross-referencing between the tables may be provided that further enables identification of problematic areas in a user design and finding the root-cause of connectivity issues. While some examples disclosed herein relate to tracking the removal and reasons for the removal of registers, systems and methods disclosed herein may track the removal and reasons for the removal of other logic circuits, such as latches and other synchronous circuits, combinatorial logic circuits, etc.

According to some examples disclosed herein, systems and methods are provided that can display a post-elaborated netlist for a user design for an IC in a register transfer level (RTL) viewer. The RTL viewer may highlight optimized nodes in the user design. The RTL viewer may show records of all optimizations made in the user design during synthesis in tables that can be filtered and queried. The RTL viewer may display hierarchical optimization information, such as which hierarchies in a user design have a high percentage of being optimized away during synthesis using a cross-probe to the table and the RTL viewer. For each optimization, the RTL viewer may provide the ability to show a sequence of optimization activities leading to the optimization. The systems and methods may cross-reference between optimization records in the table and the RTL viewer. For example, sequences of optimizations in the RTL viewer may be displayed to visualize logical paths through the hierarchies. The visualization may include the root-cause of a full sequence of optimizations.

FIG. 1 is a diagram of a portion of a user (circuit) design for a programmable integrated circuit (IC) that includes logic circuits that were optimized away during synthesis of a netlist for the user design. Figure (FIG. 1) shows logic circuits that are coupled together including 8 register circuits 101-108 and 8 circuit hierarchies 111-118. In the example of FIG. 1, a clock signal CLK is provided to the clock input of each of the register circuits 101-108 and hierarchies 111-118. Input signals IN1, IN2, and IN3 are provided to the D inputs of register circuits 101-103, respectively. The D input of register circuit 104 is stuck at a constant value as indicated by 1'h0 in FIG. 1. The signals generated at the Q outputs of register circuits 101-104 are provided to the IN inputs of circuit hierarchies 111-114, respectively. The signals generated at the OUT outputs of circuit hierarchies 111-114 are provided to the IN inputs of circuit hierarchies 115-118, respectively. The signals generated at the Q outputs of circuit hierarchies 115-118 are provided to the D inputs of register circuits 105-108, respectively. Register circuits 105-108 generate output signals OUT[1], OUT[2], OUT[3], and OUT[4], respectively, at their Q outputs.

In the example of FIG. 1, register circuits 104 and 108 are optimized away (i.e., removed) during synthesis of the user design for the programmable IC, because the D input of register circuit 104 is stuck at a constant value. As a result, the value of the signal at the Q output of register circuit 104 cannot change, which affects logic circuits that are downstream in the user design (i.e., fanouts).

Figure 2:
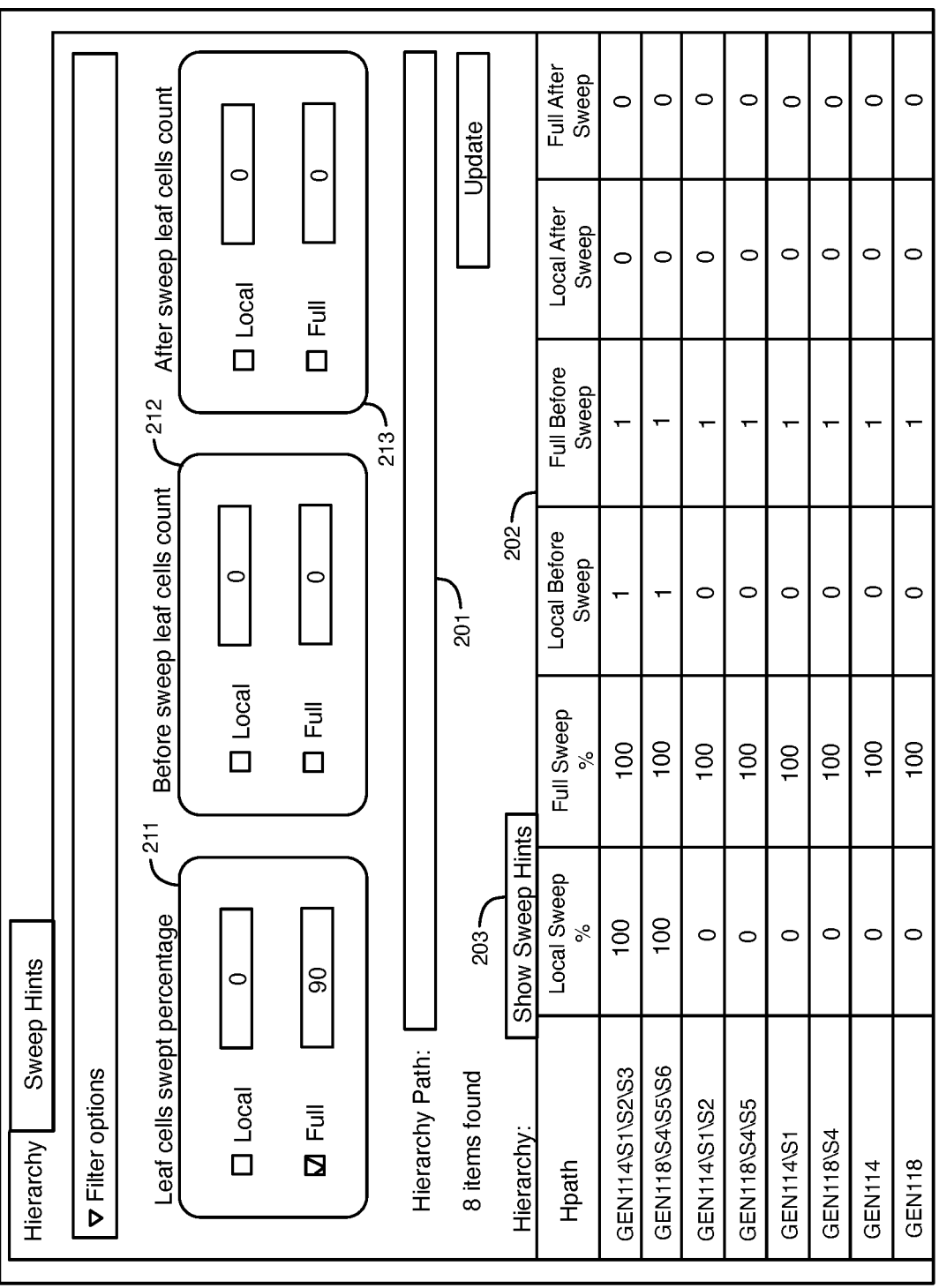
FIG. 2 is a diagram that illustrates an example of a user interface that may be generated to display hierarchy optimization information for the portion of the user design shown in FIG. 1.

FIG. 2 is a diagram that illustrates an example of a user interface that may be generated to display hierarchy optimization information for the portion of the user design shown in FIG. 1. The user interface of FIG. 2 displays filter options for the hierarchy optimization information that may be selected or entered by the user, including options to filter by amount (e.g., percentage) of leaf cells optimized (swept) in box 211, the size of the hierarchy, the size of the hierarchy and children of the hierarchy, and before and after optimizations (sweeps) for leaf cell counts in boxes 212-213. Leaf cells may refer to logic circuits that fanout from a particular node or originating logic circuit. In the specific example shown in FIG. 2, the user has selected to sweep 90% of the leaf cells during a hierarchy optimization procedure. The user interface of FIG. 2 also allows a user to filter the leaf cells by the hierarchy path by entering the hierarchy path in box 201.

As other examples, the user interface may also filter by type of module, such as the user hierarchy versus intellectual property (IP) blocks.

A database that stores the optimizations made during synthesis is then queried to locate records that match the inputs entered by the user in the user interface of FIG. 2. In the example of FIG. 2, the system locates 8 items that match the filter criteria entered into the user interface during the search of the database. An option 203 to display the cross-probing sweep optimization hints is selected by the user in this example. As another example, the user interface may provide the user with the option of displaying the source of the optimization. The 8 items located are displayed in Table 202 according to their hierarchy path (Hpath), including GEN114\S1\S2\S3, GEN118\S4\S5\S6, GEN114\S1\S2, GEN118\S4\S5, GEN114\S1, GEN118\S4, GEN114, and GEN118. GEN114 refers to circuit hierarchy 114 in FIG. 1, and GEN118 refers to circuit hierarchy 118 in FIG. 1. In the figures, S1, S2, and S3 refer to sub-hierarchies within the circuit hierarchy 114. Also, S4, S5, and S6 refer to sub-hierarchies within the circuit hierarchy 118. The local sweep percentage, full sweep percentage, local before sweep value, full before sweep value, local after sweep value, and full after sweep value are displayed for each of the 8 hierarchy paths in Table 202.

Figure 3:
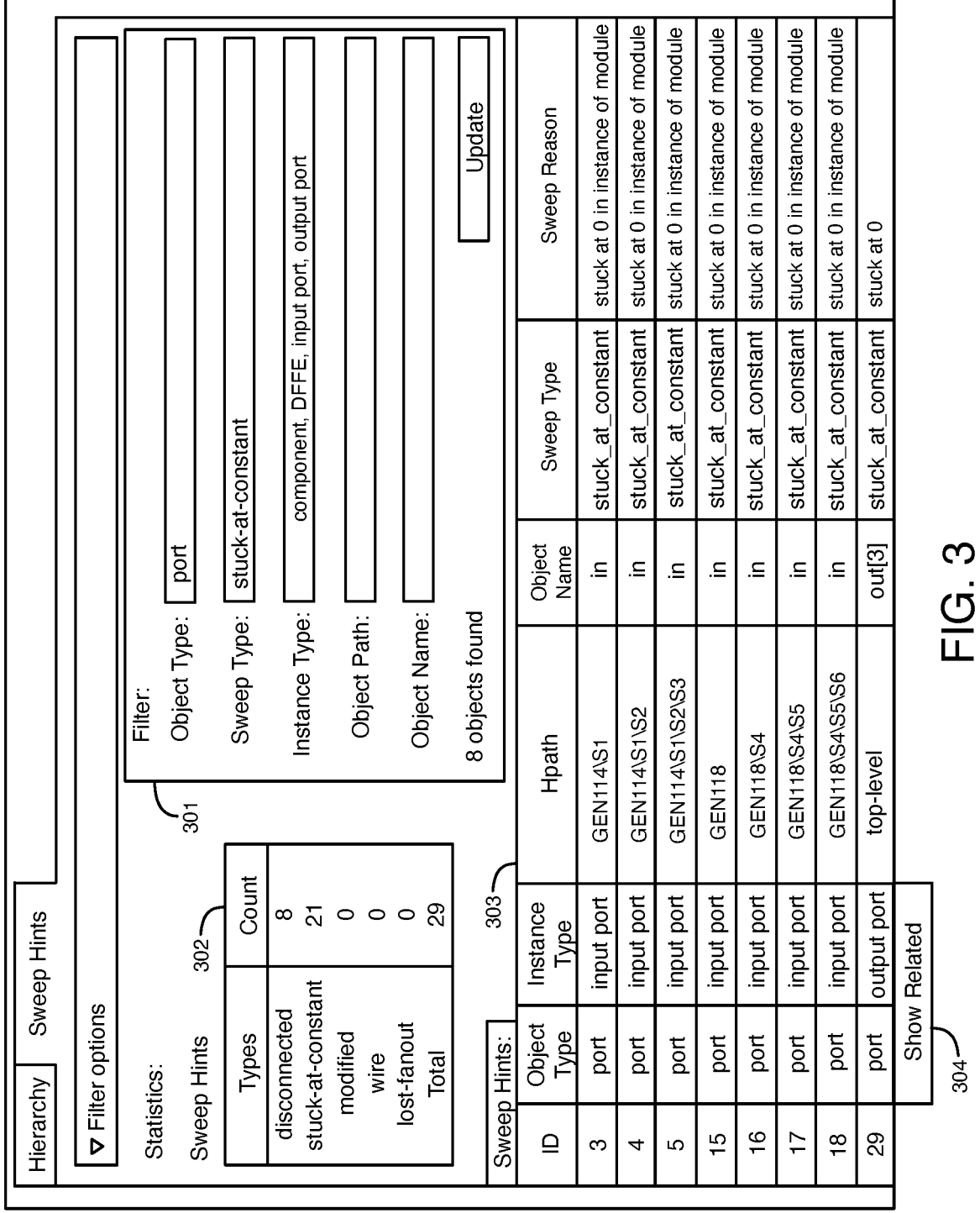
FIG. 3 is a diagram that illustrates an example of a user interface that may be generated to display optimization records for a portion of the user design shown in FIG. 1.

FIG. 3 is a diagram that illustrates an example of a user interface that may be generated to display optimization records for a portion of the user design shown in FIG. 1. The user interface of FIG. 3 may be displayed to a user on a display screen by selecting the sweep hints tab at the top of the screen. The user interface of FIG. 3 includes an input interface 301 that displays filters that may be entered by a user, including object type, sweep type (i.e., type of optimization), instance type, object path, and object name. In the example of FIG. 3, the user has entered the object type as port, the sweep type as stuck-at-constant, and the instance type as component, DFFE, input port, and output port in interface 301.

The database storing the optimizations is then queried to locate records that match the filter inputs entered by the user in interface 301. In the example of FIG. 3, 8 objects are found in the portion of the user design that match the filters entered in interface 301. Details of the filtered optimization records for 8 objects found in the database are shown in table 303 in FIG. 3. Each of the 8 objects in Table 303 is associated with a unique identification (ID), an object type (port), an instance type (input port or output port), a hierarchy path (Hpath) for the object, an object name (in or out[3]), a sweep type (stuck-at-constant), and a sweep reason (stuck at 0).

Table 302 in FIG. 3 displays statistics for the types of sweep hints matching the filters entered in interface 301. Table 302 shows 8 disconnected objects and 21 stuck-at-constant nodes for a total of 29 sweep hints in the portion of the user design analyzed. The information provided in Tables 302 and 303 can assist a user with debugging the user design with regards to determining reasons why logic circuits in the user design were optimized away during synthesis. In the example of FIG. 3, a user may select an option 304 to show a sequence of related records for any of the objects shown in Table 303.

FIG. 4 illustrates an example of a user interface that may be displayed in response to a user selecting option 304 in the user interface of FIG. 3 for the object having an ID of 29 in Table 303. In response to the user selecting option 304 for a particular object in Table 303, the database is then queried to locate recursive related records that match the record (object) in Table 303 selected by the user. The user interface shown in FIG. 4 includes a table that displays records retrieved from the database for the selected object having an ID of 29 in order to help the user trace back to the root cause of the logic circuits being optimized away in synthesis. The table of FIG. 4 displays the unique identification (ID), object type, hierarchy path (Hpath), object name, sweep type (stuck-at-constant), sweep reason, and instance type for each of the records retrieved from the database. The top row shown in FIG. 4 for object ID 29 is the original record, and the bottom row of FIG. 4 for object ID 1 is the root cause of the logic circuits being optimized away in this example. The sequence of records from bottom to top in FIG. 4 is the sequence in which the logic circuits were optimized away.

Each of the records shown in FIG. 4 indicates information for an object that was affected by object ID 1, which corresponds to a logic circuit that was optimized away. The user interfaces of FIGS. 2-4 can, for example, be generated using an RTL viewer.

Figure 5:
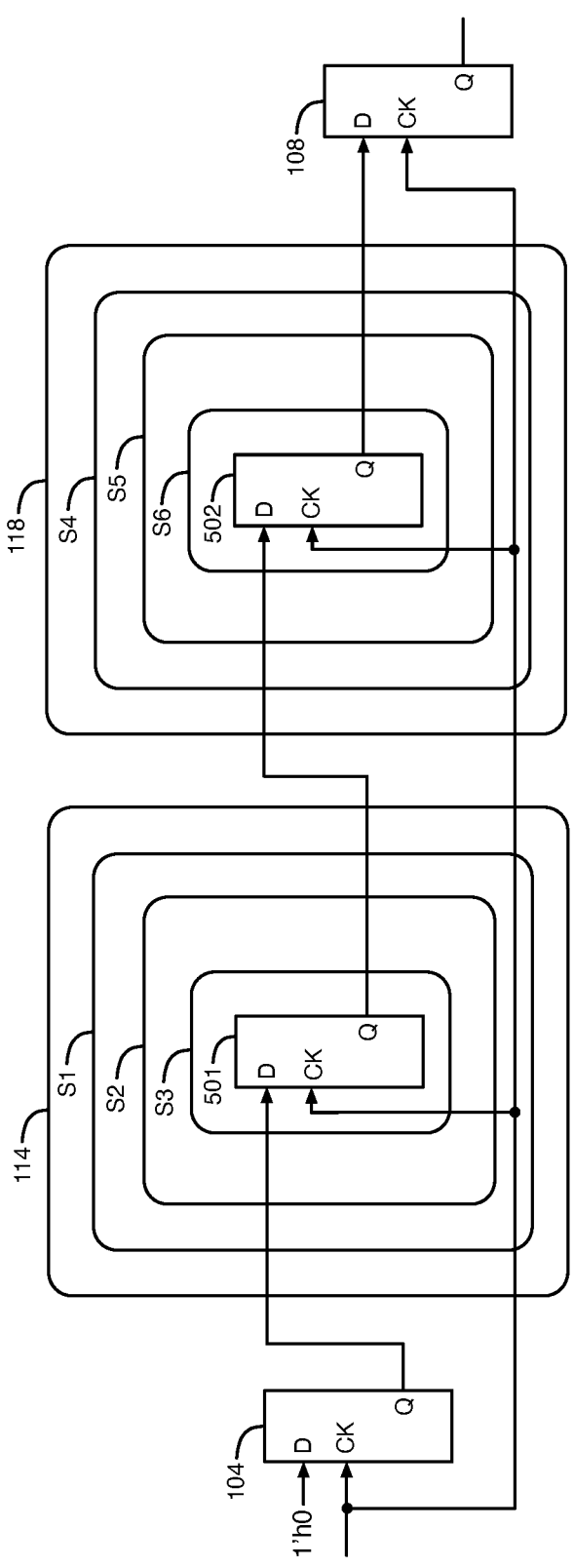
FIG. 5 is a diagram shown in a schematic viewer that illustrates further details of examples of portions of the user design shown in FIG. 1 that were optimized away during synthesis of the user design.

FIG. 5 is a diagram shown in a schematic viewer that illustrates further details of examples of portions of the user design shown in FIG. 1 that were optimized away during synthesis of the user design. The diagram of FIG. 5 illustrates register circuits 104 and 108 and circuit hierarchies 114 and 118. The D input of register circuit 104 is stuck at a constant value (1'0h), which affects other fanout logic circuits including circuit hierarchies 114 and 118. The diagram of FIG. 5 shows sub-hierarchies of circuit hierarchy 114, including sub-hierarchies S1, S2, and S3 and D flip-flop circuit 501. The diagram of FIG. 5 also shows sub-hierarchies of circuit hierarchy 118, including sub-hierarchies S4, S5, and S6, and D flip-flop circuit 502. The hierarchy paths GEN114\S1\S2\S3, GEN114\S1\S2, and GEN114\S1 shown in Tables 202 and 303 and in FIG. 4 correspond to the signal paths through corresponding sub-hierarchies S1, S2, and S3 of circuit hierarchy 114 from the Q output of register 104. The hierarchy paths GEN118\S4\S5\S6, GEN118\S4\S5, and GEN118\S4 shown in Tables 202 and 303 and in FIG. 4 correspond to the signal paths through corresponding sub-hierarchies S4, S5, and S6 of circuit hierarchy 118 from the Q output of flip-flop 501. Thus, the details shown in Tables 202 and 303 and in the table of FIG. 4 for these hierarchy paths are for the corresponding sub-hierarchies of circuit hierarchies 114 and 118. These details help a user determine why logic circuits in the user design were optimized away during synthesis and the root cause of the removal of the logic circuits.

Figure 6:
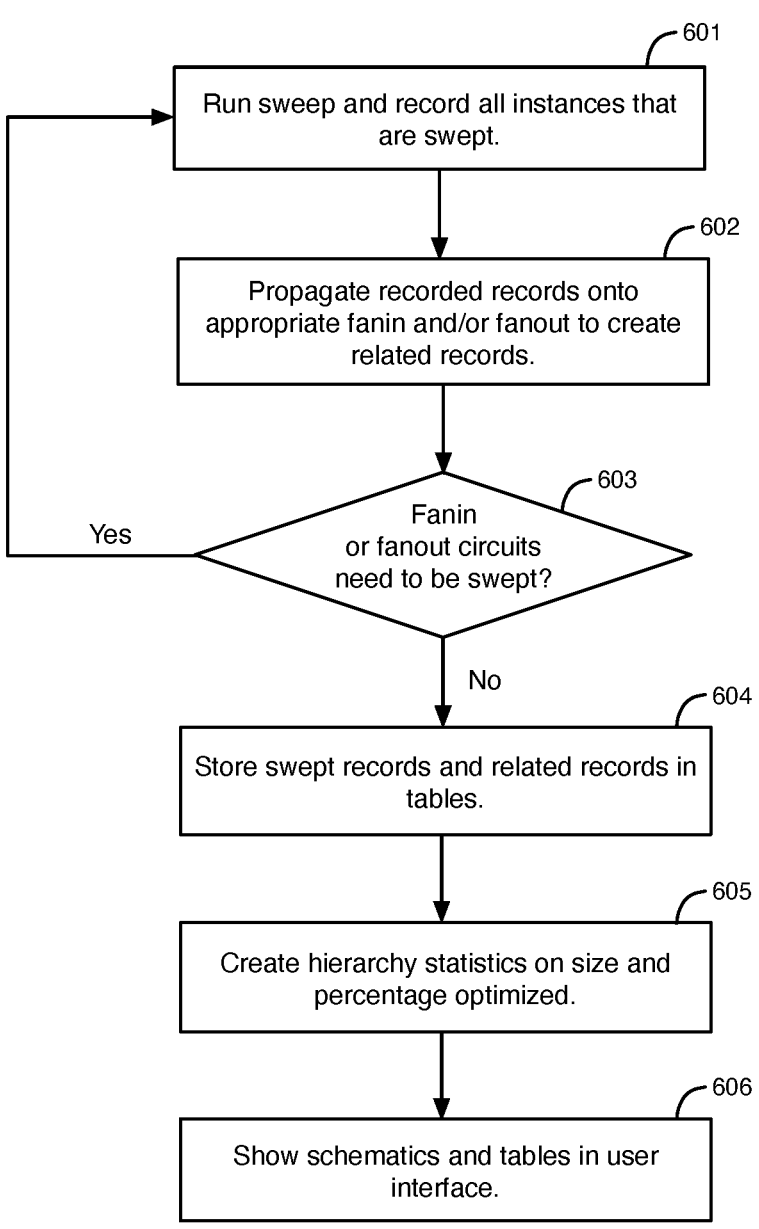
FIG. 6 is a flow chart that illustrates examples of operations that may be performed to assist a user in determining reasons for why one or more logic circuits in a user design for a programmable IC were optimized away during synthesis.

FIG. 6 is a flow chart that illustrates examples of operations that may be performed to assist a user in determining reasons for why one or more logic circuits in a user design for a programmable IC were optimized away during synthesis. After elaboration of the user design, a circuit design system takes a write design snapshot of the user design. Then, in operation 601, the circuit design system runs a sweep (i.e., performs optimizations) of at least a portion of the user design in the write design snapshot and records all instances in the user design that are swept (i.e., optimized away) in a database. The sweep performed in operation 601 is the first optimization performed in synthesis after elaboration in order to collect optimization hints for the user interfaces (e.g., the user interfaces shown in FIG. 3-4). Bad connections in the user design trigger logic circuits in the user design that cause the bad connections to be optimized away during synthesis of the user design.

In operation 602, the circuit design system propagates records that are recorded in operation 601 to appropriate fanin circuits in the user design and/or to appropriate fanout circuits in the user design for the logic circuits that have been swept (i.e., optimized away) to create related records (e.g., in the database). The circuit design system may, for example, write the records to structured query language (SQL) tables in the database. The fanin circuits provide inputs to the logic circuits optimized away, and the fanout circuits are affected by outputs of the logic circuits optimized away. In operation 603, the circuit design system determines if any of the fanin circuits or the fanout circuits identified in operation 602 need to be swept (i.e., optimized away). If any of these fanin or fanout circuits need to be swept, then these fanin and fanout circuits are swept and recorded in the database in operation 601 as additional recorded records, and then these additional recorded records are propagated to their fanin and fanout circuits to create additional related records in operation 602. If none of the fanin or fanout circuits need to be swept in operation 603, then the circuit design system proceeds to operation 604. In operation 604, the circuit design system stores the swept records and related records created in operations 601-602 in the tables. In operation 605, the circuit design system creates hierarchy statistics on the size and the percentage of the user design that is optimized. In operation 606, the circuit design system shows elaborated schematics of at least a portion of the user design (e.g., as shown in FIG. 5) affected by the optimizations and tables for the portion of the user design affected by the optimizations in a user interface (e.g., as shown in FIGS. 2-4). The user interface can display cross-probing between the schematics and the tables.

The sweep may be performed in operation 601 on a hierarchical, folded netlist of the user design for the IC. The sweep performed in operation 601 removes (i.e., optimizes away) stuck instances of logic circuits (i.e., logic circuits with stuck inputs or outputs), wire instances (e.g., disconnected wires), and instances of logic circuits without fanouts (i.e., logic circuits with no output connections). The sweep propagates across hierarchy boundaries in the user design. For example, if an input port is stuck in a module instance, the sweep propagates into the module. As another example, if an output port loses fanout in a module instance, the sweep propagates into the module. If an input port is unused in a module, the sweep propagates to all instances of the module. If an output port is stuck in a module, the sweep propagates to all instances of the module. In these examples, a module may refer to a group of logic circuits that is repeated in multiple instances in the user design for the IC. Folded modules are duplicated if different instances have different input ports that are stuck or output ports that are unused.

When records and related records are swept, the system records the swept records in the database. For example, the circuit design system can record in the database stuck instances, wire instances, lost fanouts, and modified instances of logic circuits in the user design. The circuit design system can annotate record identifications onto affected networks and instance ports. As an example, if an instance is stuck at a constant, the circuit design system can annotate the record onto all fanout instance ports and all networks driving the instance in the user design. As another example, if an instance loses fanout, the circuit design system can annotate the record onto all networks driving the instance. As yet another example, if an instance has a fanout-free network removed, the circuit design system can propagate annotated records onto driving instance ports.

When recording sweep activity, the circuit design system records related sweep records in the database. For example, if a D flip-flop is stuck at a constant due to a stuck data input, the records annotated on the data input are related records. As another example, if an instance loses fanout, the records annotated on the output ports are related records.

Figure 7:
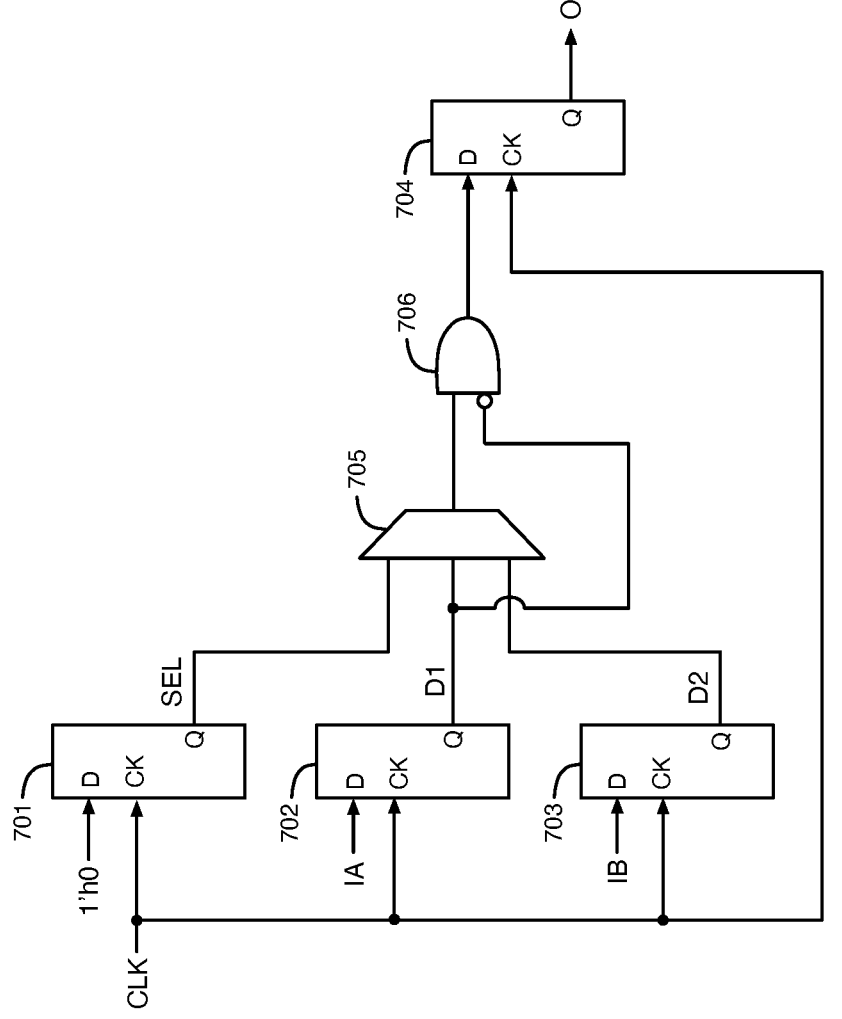
FIG. 7 is a schematic diagram of logic circuits in a user design for a programmable logic IC that illustrates an example of how the system can propagate related records in a database.

FIG. 7 is a schematic diagram of logic circuits in a user design for a programmable logic IC that illustrates an example of how the circuit design system can propagate related records in a database. FIG. 7 illustrates register circuits (D flip-flops) 701-704, multiplexer circuit 705, and logic AND gate circuit 706. In example of FIG. 7, the D input of register circuit 701 is stuck at a constant value (1'0h). A clock signal is provided to the clock (CK) inputs of register circuits 701-704. The signal SEL generated at the Q output of register circuit 701 is provided to the select input of multiplexer circuit 705. The signals D1 and D2 generated at the Q outputs of register circuits 702-703, respectively, are provided to the data inputs of multiplexer circuit 705. Table 1 below illustrates examples of related records that are propagated by the circuit design system and stored in the database for the logic circuits of FIG. 7 during optimization.

TABLE 1

| Record | Error | Cause | Propagating record to |
|---|---|---|---|
| 1 | Register 701 stuck at 0 due to D input at constant value | D input signal | Fanout: Input signal SEL to multiplexer 705 |
| 2 | Multiplexer 705 functions as a wire due to SEL signal being stuck at 0 | Register 701 | Fanout: AND gate 706 Fanin: networks driving signals D1 and D2 |
| 3 | AND gate 706 combines signal D1 with the inversion of signal D1 and becomes stuck at 0 | Multiplexer 705 | Fanout: D input of register 704 Fanin: networks driving AND gate 706 |
| 4 | Register 703 lost fanout | Multiplexer 705 | Fanin: input signal IB and clock signal CLK |
| 5 | Register 704 stuck at 0 | AND gate 706 | Fanout: Output signal 0 at output Q Fanin: network for clock signal CLK |
| 6 | Register 702 lost fanout | AND gate 706 | Fanin: networks for input signals IA and CLK |
| 7 | Input port at signal IA lost all fanout | Register 702 | |
| 8 | Input port at signal IB lost all fanout | Register 703 | |
| 9 | Input port receiving clock signal CLK lost all fanout | Registers 701-704 | |
| 10 | Signal 0 at output Q of register 704 is stuck at 0 | Register 704 | |

The circuit design system disclosed herein can also sweep on folded hierarchies in one or more portions of a user design for an IC. If the circuit design system sweeps an instance of logic circuits in the user design, the circuit design system sweeps each instance of the logic circuits in the hierarchy. The circuit design system also sweeps records shown to the user in the user interface on each instance of the logic circuits in the hierarchy, so that the user can identify related records. The circuit design system can also propagate related records in folded hierarchies of logic circuits in a user design for an IC. The circuit design system may store in the database a master identification (ID) for groups of sweep records on instances of the same object. The circuit design system can propagate related master IDs, instead of individual records. When generating individual records in the database, the circuit design system can find corresponding individual records of related master IDs by name. For example, the circuit design system can perform a hash of a group ID for a hierarchy instance name to locate a record ID. The circuit design system can use IDs instead of names for reduced memory storage and faster lookup of records in the database.

The circuit design system can allow a user to validate related sweep records in the database for logic circuits that have been optimized away in a user design for an IC. For example, the circuit design system provides the user with circuit diagrams, as shown for example in FIG. 5, that allow a user to visually inspect a user design and to trace the signal paths in the user design related to optimizations made during synthesis. After a first iteration of the sweep, each subsequent sweep performed by the circuit design system generates a record that is related to the record indicating that a logic circuit was optimized away in the user design. Providing these related records helps a user to find missing record propagation and related records.

According to other examples, the circuit design system can also perform other synthesis optimizations of user designs for ICs. The circuit design system can perform categories of optimizations on user designs including stuck at constant errors, wire errors, and fanout-free logic removal. The circuit design system can also remove duplicate logic circuits in user designs during synthesis. The circuit design system can generate a record for each duplicate logic circuit removed in a user design. The circuit design system then generates related records on input ports of both original and removed logic circuits. The circuit design system propagates record IDs onto the fanout of the removed logic circuits and the networks connected to the drivers of the removed logic circuits.

The circuit design system can also resynthesize an original cloud of logic circuits in a user design into a new cloud of logic circuits. The circuit design system can record as resynthesized all instances of logic circuits in the original cloud. Related records are all records in the original cloud. The circuit design system can propagate new record IDs onto all logic gates in the new cloud, any fanouts that are stuck at constant values, and any networks driving the original cloud that do not drive the new cloud.

After multiple steps of optimizations, the post-elaborated schematic viewer may not have all instances involved in an optimization performed in synthesis. An optimization sequence should lead to logic circuits in the original circuit schematic. The logic circuits can be visualized in the schematic viewer. If it is too difficult to trace the full sequence of optimizations performed during synthesis, intermediate snapshots of the optimizations can be used and displayed to the user in the user interface. The circuit design system can then show only the optimizations that happen after the intermediate snapshot in the user interface.

Figure 8:
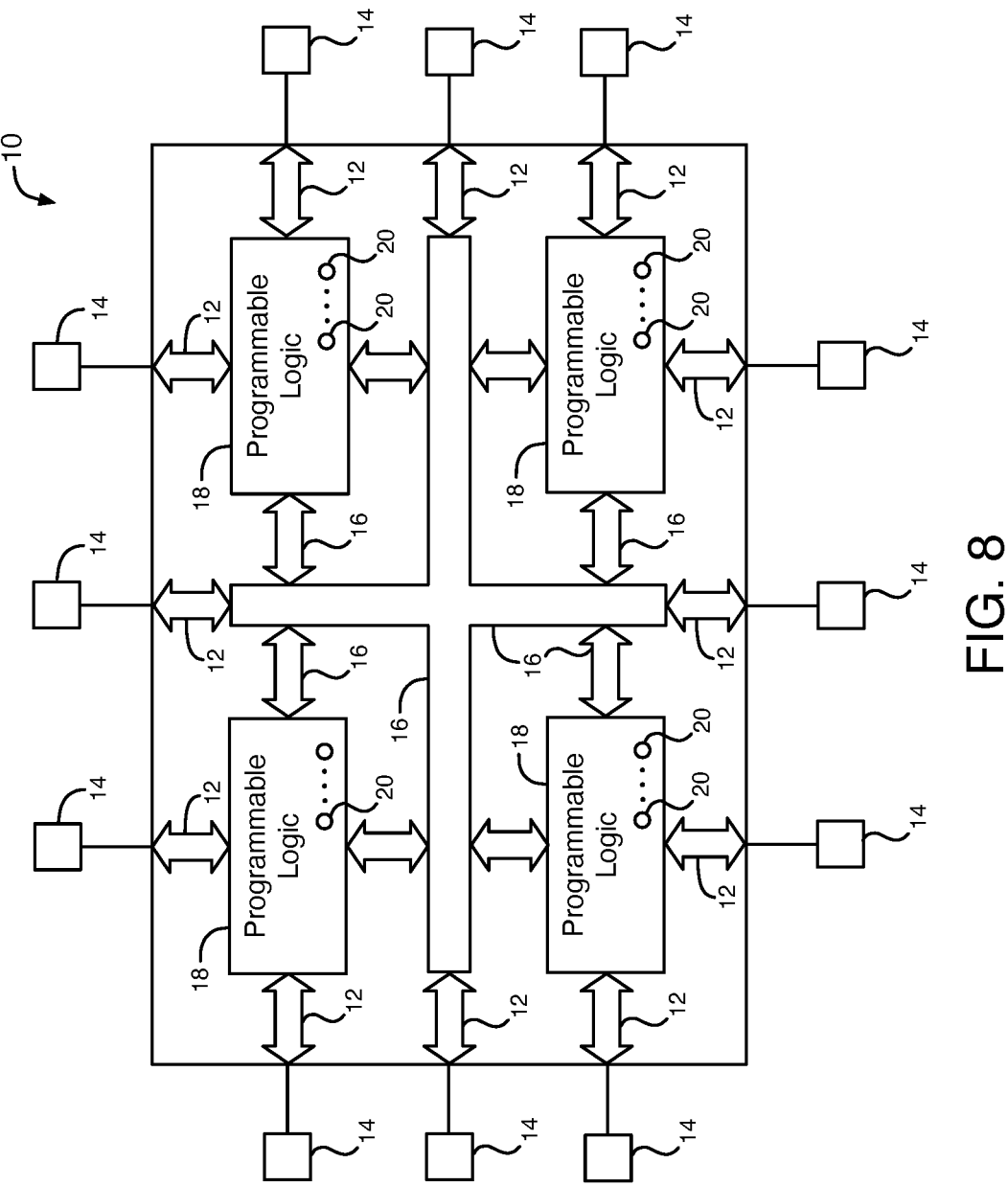
FIG. 8 is a diagram of an illustrative programmable (i.e., configurable) logic integrated circuit (IC) that may be programmed to a user design as disclosed herein.

FIG. 8 is a diagram of an illustrative programmable (i.e., configurable) logic integrated circuit (IC) 10 that may be programmed to a user design as disclosed herein. As shown in FIG. 8, programmable logic integrated circuit 10 may have input-output circuitry 12 for driving signals off of IC 10 and for receiving signals from other devices via input-output pads 14. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects). Programmable logic circuitry 18 may include combinational and sequential logic circuitry. Programmable logic circuitry 18 may be configured to perform custom logic functions.

Programmable logic IC 10 contains memory elements 20 that can be loaded with configuration data using pads 14 and input-output circuitry 12. Once loaded, the memory elements 20 may each provide a corresponding static control output signal that controls the state of an associated logic component in programmable logic circuitry 18.

Typically, the memory element output signals are used to control the gates of field-effect transistors. In the context of programmable integrated circuits, the memory elements 20 store configuration data and are sometimes referred to as configuration random-access memory (CRAM) cells. The configuration data programs the programmable logic 18 to perform the custom logic functions according to the user design.

It can be a significant undertaking to design and implement a user (custom) logic circuit design in for an integrated circuit (IC), such as a programmable logic IC. Logic designers therefore generally use logic design systems based on computer-aided-design (CAD) tools to assist them in designing circuits for ICs. A logic design system can help a logic designer design and test complex circuits for a system. When a design is complete, the logic design system may be used to generate configuration data for electrically programming the appropriate programmable logic IC according to the user design.

Figure 9:
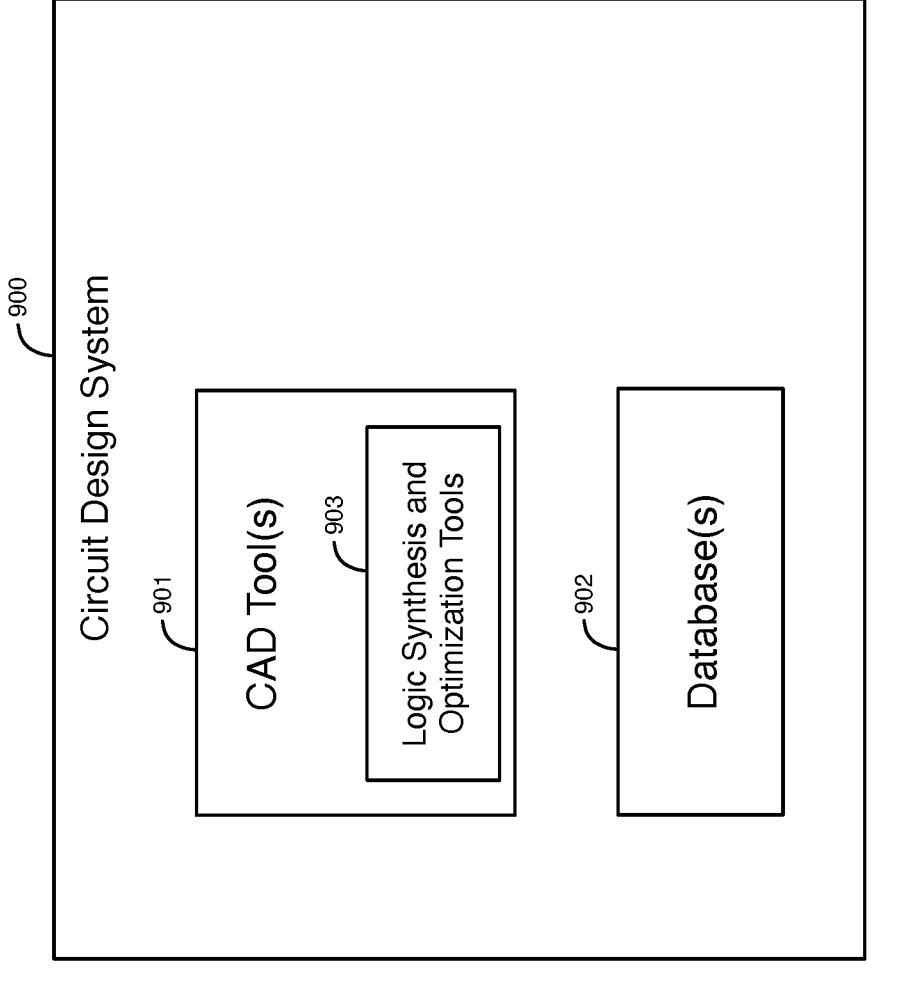
FIG. 9 shows an illustrative circuit design system that can perform functions disclosed herein.

An illustrative circuit design system 900 is shown in FIG. 9. Any of the systems and methods disclosed herein may be implemented by the circuit design system 900. Circuit design system 900 may be implemented on integrated circuit design computing equipment. Circuit design system 900 may, for example, include one or more networked computers with processors, memory, mass storage, input/output devices, etc. System 900 may, for example, be based on one or more processors such as personal computers, workstations, etc. The processor(s) may be linked using a network (e.g., a local or wide area network). Memory in these computers or external memory and storage devices may be used to store instructions and data. Circuit design system 900 can be used to create a circuit design for any type of IC, such as a programmable logic IC.

Software-based components such as computer-aided design (CAD) tools 901 and databases 902 reside on system 900. During operation, executable software such as the software of computer aided design tools 901 runs on the processor(s) of system 900. Databases 902 are used to store data for the operation of system 900. In general, software and data may be stored in non-transitory computer readable storage media (e.g., tangible computer readable storage media).

CAD tools 901 may include logic synthesis and optimization tools 903 that perform the systems and methods disclosed herein. Once the functional operation of the circuit design has been determined to be satisfactory, the logic synthesis and optimization tools 903 may generate a gate-level netlist of the circuit design, for example, using gates from a particular library pertaining to a targeted process supported by a foundry that has been selected to produce the integrated circuit. Alternatively, the logic synthesis and optimization tools 903 may generate a gate-level netlist of the circuit design using gates of a targeted programmable IC (i.e., in the logic and interconnect resources of a particular programmable IC product or product family).

The logic synthesis and optimization tools 903 may optimize the circuit design by making appropriate selections of hardware to implement different logic functions in the circuit design based on the circuit design data and constraint data entered by the logic designer. As an example, the logic synthesis and optimization tools 903 may perform multi-level logic optimization and technology mapping based on the length of a combinational path between registers in the circuit design and corresponding timing constraints that were entered by the logic designer.

After logic synthesis and optimization, the circuit design system 900 may use tools such as placement, routing, and physical synthesis tools to perform physical design steps (layout synthesis operations). These tools can be used to determine where to place each gate of the gate-level netlist. These tools create orderly and efficient implementations of circuit designs for any targeted integrated circuit (e.g., for a given programmable integrated circuit such as a field-programmable gate array (FPGA)).

Software stored on the non-transitory computer readable storage media may be executed on system 900. When the software of system 900 is installed, the storage of system 900 has instructions and data that cause the computing equipment in system 900 to execute various methods (processes). When performing these processes, the computing equipment is configured to implement the functions of circuit design system 900.

The computer aided design (CAD) tools 901, some or all of which are sometimes referred to collectively as a CAD tool, a circuit design tool, or an electronic design automation (EDA) tool, may be provided by a single vendor or by multiple vendors. Tools 901 may be provided as one or more suites of tools (e.g., a compiler suite for performing tasks associated with implementing a circuit design in a programmable IC) and/or as one or more separate software components (tools). Database(s) 902 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now disclosed. Example 1 is a method of using an integrated circuit design tool to optimize a circuit design for an integrated circuit, the method comprising: recording optimizations of first circuits in the circuit design in first records in a database that are performed during synthesis of the circuit design for the integrated circuit; creating second records in the database that indicate second circuits in the circuit design that fanin to or fanout from the first circuits and that are affected by the optimizations; determining a root cause of at least one of the optimizations using the first records and the second records in the database; and determining a sequence of the optimizations affecting the first circuits and the second circuits using the first records and the second records in the database.

In Example 2, the method of Example 1 may further comprise: providing data for a table to be presented in a user interface comprising a hierarchy of instances of logic circuits that indicates how many of the first circuits in each of the instances was optimized away during the synthesis.

In Example 3, the method of any one of Examples 1-2 may optionally include, wherein recording the optimizations of the first circuits in the circuit design further comprises: recording logic circuits in the circuit design that have been removed during the synthesis in the first records.

In Example 4, the method of any one of Examples 1-3 may further comprise:

generating tables that indicate connections between the first circuits and the second circuits; and filtering between the tables to identify logic circuits in the circuit design that have been optimized away during the synthesis.

In Example 5, the method of any one of Examples 1-4 may further comprise: providing hierarchy statistics on a size and a percentage of the circuit design that is affected by the optimizations.

In Example 6, the method of any one of Examples 1-5 may further comprise: providing data to display a circuit schematic of the first circuits and the second circuits that are affected by the optimizations.

In Example 7, the method of any one of Examples 1-6 may further comprise: recording additional optimizations of at least a subset of the second circuits in the circuit design performed during the synthesis in third records in the database; and creating fourth records in the database that indicate third circuits in the circuit design that fanin to or fanout from the subset of the second circuits and that are affected by the additional optimizations.

In Example 8, the method of any one of Examples 1-7 may further comprise: providing data for a user interface that indicate the sequence of the optimizations affecting the first circuits and the second circuits and the root cause using the first records and the second records in the database.

In Example 9, the method of Example 3 may optionally include, wherein the logic circuits in the circuit design that have been removed during the synthesis have terminals stuck at constant values, function as wires, or have lost fanouts.

Example 10 is a non-transitory computer-readable storage medium comprising instructions stored thereon for causing a computer to execute a method for optimizing a circuit design for an integrated circuit using a design tool, the method comprising: storing optimizations that remove first circuits in the circuit design during synthesis of the circuit design for the integrated circuit in first records in a database; storing second records in the database that indicate second circuits in the circuit design that fanin to or fanout from the first circuits, wherein functions of the second circuits are affected by the optimizations; and providing data for a user interface that indicate a root cause of one of the optimizations affecting the first circuits and the second circuits and a sequence of the optimizations affecting the first circuits and the second circuits using the first records and the second records stored in the database.

In Example 11, the non-transitory computer-readable storage medium of Example 10 may optionally include, wherein providing the data for the user interface further comprises: generating tables that indicate connections in the circuit design between the first circuits and the second circuits; and filtering between the tables to identify portions of the circuit design that have been optimized away during the synthesis.

In Example 12, the non-transitory computer-readable storage medium of any one of Examples 10-11 may optionally include, wherein providing the data for the user interface further comprises: providing data for a table to be presented in the user interface comprising a hierarchy of instances of logic circuits in the circuit design that indicates how many of the first circuits in each of the instances were removed during the synthesis.

In Example 13, the non-transitory computer-readable storage medium of any one of Examples 10-12 may optionally include, wherein providing the data for the user interface further comprises: providing data to display a circuit schematic of the first circuits and the second circuits that are affected by the optimizations.

In Example 14, the non-transitory computer-readable storage medium of any one of Examples 10-13 may optionally include, wherein providing the data for the user interface further comprises: storing optimizations that remove at least of subset of the second circuits in the circuit design during the synthesis in third records in the database.

In Example 15, the non-transitory computer-readable storage medium of any one of Examples 10-14 may optionally include, wherein storing optimizations that remove the first circuits in the circuit design further comprises: storing optimizations from a hierarchical, folded netlist that represents the circuit design, wherein the first circuits and the second circuits are in multiple hierarchies in the netlist.

Example 16 is a circuit design system configured to implement a circuit design tool for optimizing a circuit design for an integrated circuit, wherein the circuit design system comprises: logic synthesis and optimization tools that perform optimizations of first circuits in the circuit design during synthesis of the circuit design for the integrated circuit and that store the optimizations as first records in a database; wherein the logic synthesis and optimization tools store second records in the database that identify second circuits in the circuit design that fanin to the first circuits and that are affected by the optimizations; wherein the logic synthesis and optimization tools store third records in the database that identify third circuits in the circuit design that fanout from the first circuits and that are affected by the optimizations, and wherein the logic synthesis and optimization tools provide data for a user interface that indicate a sequence of the optimizations affecting the first circuits, the second circuits, and the third circuits using the first records, the second records, and the third records stored in the database.

In Example 17, the circuit design system of Example 16 may optionally include, wherein the logic synthesis and optimization tools provide data for a table to be presented in the user interface comprising a hierarchy of instances of logic circuits that indicates how many of the first circuits in each of the instances was removed during the synthesis.

In Example 18, the circuit design system of any one of Examples 16-17 may optionally include, wherein the logic synthesis and optimization tools remove the first circuits in the circuit design during the synthesis and store removal of the first circuits as the first records.

In Example 19, the circuit design system of any one of Examples 16-18 may optionally include, wherein the logic synthesis and optimization tools generate tables that indicate connections between the first circuits, the second circuits, and the third circuits, and filter between the tables to identify logic circuits in the circuit design that have been optimized away during the synthesis.

In Example 20, the circuit design system of any one of Examples 16-19 may optionally include, wherein the logic synthesis and optimization tools provide data for the user interface that indicate a root cause of one of the optimizations affecting the first circuits, the second circuits and the third circuits.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. A method of using an integrated circuit design tool to optimize a circuit design for an integrated circuit, the method comprising:

recording optimizations of first circuits in the circuit design in first records in a database that are performed during synthesis of the circuit design for the integrated circuit;

creating second records in the database that indicate second circuits in the circuit design that fanin to or fanout from the first circuits and that are affected by the optimizations;

determining a root cause of at least one of the optimizations using the first records and the second records in the database;

determining a sequence of the optimizations affecting the first circuits and the second circuits using the first records and the second records in the database;

sweeping each instance of logic circuits in a hierarchy in the circuit design; and providing first data for a table to be presented in a user interface comprising the hierarchy of instances of the logic circuits that indicates how many of the first circuits in each of the instances were optimized away during the synthesis.

2. The method of claim 1, wherein the hierarchy comprises sub-hierarchies.

3. The method of claim 1, wherein recording the optimizations of the first circuits in the circuit design further comprises:

recording the first circuits in the circuit design that have been removed during the synthesis in the first records.

4. The method of claim 3, wherein the first circuits in the circuit design that have been removed during the synthesis have terminals stuck at constant values, function as wires, or have lost fanouts.

5. The method of claim 1 further comprising:

generating tables that indicate connections between the first circuits and the second circuits; and filtering between the tables to identify the first and the second circuits in the circuit design that have been optimized away during the synthesis.

6. The method of claim 1 further comprising:

providing hierarchy statistics on a size and a percentage of the circuit design that is affected by the optimizations.

7. The method of claim 1 further comprising:

providing second data to display a circuit schematic of the first circuits and the second circuits that are affected by the optimizations.

8. The method of claim 1 further comprising:

recording additional optimizations of at least a subset of the second circuits in the circuit design performed during the synthesis in third records in the database; and creating fourth records in the database that indicate third circuits in the circuit design that fanin to or fanout from the subset of the second circuits and that are affected by the additional optimizations.

9. The method of claim 1 further comprising:

providing second data for the user interface that indicate the sequence of the optimizations affecting the first circuits and the second circuits and the root cause using the first records and the second records in the database.

10. A non-transitory computer-readable storage medium comprising instructions stored thereon for causing a computer to execute a method for optimizing a circuit design for an integrated circuit using a design tool, the method comprising:

storing optimizations that remove first circuits in the circuit design during synthesis of the circuit design for the integrated circuit in first records in a database;

storing second records in the database that indicate second circuits in the circuit design that fanin to or fanout from the first circuits, wherein functions of the second circuits are affected by the optimizations;

sweeping each instance of logic circuits in a hierarchy in the circuit design; and providing first data for a user interface that indicate a root cause of one of the optimizations affecting the first circuits and the second circuits and a sequence of the optimizations affecting the first circuits and the second circuits using the first records and the second records stored in the database, wherein the first data comprises the hierarchy of instances of the logic circuits in the circuit design that indicates how many of the first circuits in each of the instances were removed during the synthesis.

11. The non-transitory computer-readable storage medium of claim 10, wherein providing the first data for the user interface further comprises:

generating tables that indicate connections in the circuit design between the first circuits and the second circuits; and filtering between the tables to identify portions of the circuit design that have been optimized away during the synthesis.

12. The non-transitory computer-readable storage medium of claim 10, wherein sweeping each instance of the logic circuits in the hierarchy in the circuit design further comprises sweeping into all instances of a module in the circuit design, and wherein the module is a group of the logic circuits that is repeated in the instances of the module in the circuit design.

13. The non-transitory computer-readable storage medium of claim 10, wherein providing the first data for the user interface further comprises:

providing second data to display a circuit schematic of the first circuits and the second circuits that are affected by the optimizations.

14. The non-transitory computer-readable storage medium of claim 10 further comprising:

storing additional optimizations that remove at least a subset of the second circuits in the circuit design during the synthesis in third records in the database.

15. The non-transitory computer-readable storage medium of claim 10, wherein storing the optimizations that remove the first circuits in the circuit design further comprises:

storing the optimizations from a hierarchical, folded netlist that represents the circuit design, wherein the first circuits and the second circuits are in multiple hierarchies in the netlist.

16. A circuit design system configured to implement a circuit design tool for optimizing a circuit design for an integrated circuit, wherein the circuit design system comprises:

logic synthesis and optimization tools that perform optimizations of first circuits in the circuit design during synthesis of the circuit design for the integrated circuit and that store the optimizations as first records in a database;

wherein the logic synthesis and optimization tools store second records in the database that identify second circuits in the circuit design that fanin to the first circuits and that are affected by the optimizations;

wherein the logic synthesis and optimization tools store third records in the database that identify third circuits in the circuit design that fanout from the first circuits and that are affected by the optimizations, wherein the logic synthesis and optimization tools provide first data for a user interface that indicate a sequence of the optimizations affecting the first circuits, the second circuits, and the third circuits using the first records, the second records, and the third records stored in the database, and wherein the logic synthesis and optimization tools sweep each instance of logic circuits in a hierarchy in the circuit design and provide second data for the user interface comprising the hierarchy of instances of the logic circuits that indicates how many of the first circuits in each of the instances were removed during the synthesis.

17. The circuit design system of claim 16, wherein the logic synthesis and optimization tools sweep into all instances of a module in the circuit design, and wherein the module is a group of the logic circuits that is repeated in the instances of the module in the circuit design.

18. The circuit design system of claim 16, wherein the logic synthesis and optimization tools remove the first circuits in the circuit design during the synthesis and store removal of the first circuits as the first records.

19. The circuit design system of claim 16, wherein the logic synthesis and optimization tools generate tables that indicate connections between the first circuits, the second circuits, and the third circuits, and filter between the tables to identify the first, the second, and the third circuits in the circuit design that have been optimized away during the synthesis.

20. The circuit design system of claim 16, wherein the logic synthesis and optimization tools provide third data for the user interface that indicate a root cause of one of the optimizations affecting the first circuits, the second circuits, and the third circuits.

* * * * *